(12) United States Patent
Yan et al.

(10) Patent No.: US 12,549,157 B2
(45) Date of Patent: Feb. 10, 2026

(54) TUNABLE RESISTOR CIRCUITS

(71) Applicant: Avago Technologies International Sales Pte. Limited, Singapore (SG)

(72) Inventors: Han Yan, Woerden (NL); Jan Mulder, Houten (NL); Jan Roelof Westra, Uithoorn (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/784,671

(22) Filed: Jul. 25, 2024

(65) Prior Publication Data

US 2026/0031795 A1 Jan. 29, 2026

(51) Int. Cl.
*H03H 11/28* (2006.01)
*H03K 17/56* (2006.01)
*H04B 1/04* (2006.01)

(52) U.S. Cl.
CPC ............. *H03H 11/28* (2013.01); *H03K 17/56* (2013.01); *H04B 1/04* (2013.01)

(58) Field of Classification Search
CPC .... H03K 17/56; H03K 17/567; H03K 17/687; H04B 1/04; H04B 1/0475; H03H 11/28
See application file for complete search history.

(56) References Cited

U.S. PATENT DOCUMENTS

| | | | |
|---|---|---|---|
| 6,819,768 B1 * | 11/2004 | Sculley | H03G 3/348 381/104 |
| 7,245,529 B2 * | 7/2007 | Chen | G11C 16/10 365/185.05 |
| 9,793,908 B2 * | 10/2017 | Shibata | H03M 1/06 |
| 10,026,753 B2 * | 7/2018 | Faul | H10D 89/911 |
| 2006/0244480 A1 | 11/2006 | Chan | |
| 2010/0066405 A1 | 3/2010 | Chang et al. | |

OTHER PUBLICATIONS

Extended European Search Report for European Patent Application No. 25191296.0 dated Dec. 15, 2025; 8 pages.
Gurne Thibaut et al: "A 20Gbps 1.2GHz full-duplex integerated AFE in 28nm CMOS for copper access", ESSCIRC 2017—43RD IEEE European Solid State Circuits Conference, IEEE Sep. 11, 2017 (Sep. 11, 2017), pp. 107-110, XP033246236, DOI: 10.1109/ESSCIRC.2017.8094537 [retrieved on Nov. 2, 2017].

* cited by examiner

*Primary Examiner* — Diana J. Cheng
(74) *Attorney, Agent, or Firm* — Quarles & Brady LLP

(57) ABSTRACT

A tunable termination resistor circuit associated with a line driver in a line on-chip is provided. The circuit includes a first current source and a first resistor coupled to the first current source and the line. The circuit also includes a first diode comprising a first terminal and a second terminal, the first terminal being coupled to the first resistor and the second terminal being coupled to a gate of a transistor, the gate being coupled to a gate voltage. The circuit also includes a capacitor coupled to the gate and the source of the transistor. The circuit also includes a third resistor coupled in series to a fourth resistor in the line each of the third resistor and the fourth resistor comprising a resistance changed by the gate voltage. There are other embodiments as well.

20 Claims, 5 Drawing Sheets

US 12,549,157 B2

TUNABLE RESISTOR CIRCUITS

BACKGROUND OF THE INVENTION

In communication systems, maintaining signal integrity and meeting specific transmission requirements such as return loss and amplitude specifications are required for effective data transmission. For example, a typical setup includes a line driver that feeds a signal through on-chip and off-chip components, ultimately reaching a load resistor. Passive termination resistors are utilized to match impedance and minimize reflections, which is essential for maintaining good return loss levels. However, on-chip resistors often exhibit a significant variation (e.g., ±20%). This variability can stem from manufacturing process variations, temperature changes, and voltage fluctuations, posing a considerable challenge in meeting the stringent return loss and output amplitude specifications required for reliable communication.

Over the past, various variability issues were managed using analog techniques such as increasing the voltage swing or enhancing the linearity of the line driver. While effective, these methods have downsides. Higher voltage swings and enhanced linearity requirements typically lead to increased power consumption, which is undesirable, especially in battery-operated devices like mobile phones and portable communications equipment. To support high performance and robust line drivers, additional circuitry is often required, which increases the silicon footprint, impacting the cost and feasibility of integrating these components into compact devices. Therefore, improvements desired.

BRIEF DESCRIPTION OF THE DRAWINGS

A further understanding of the nature and advantages of particular embodiments may be realized by reference to the remaining portions of the specification and the drawings, in which reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
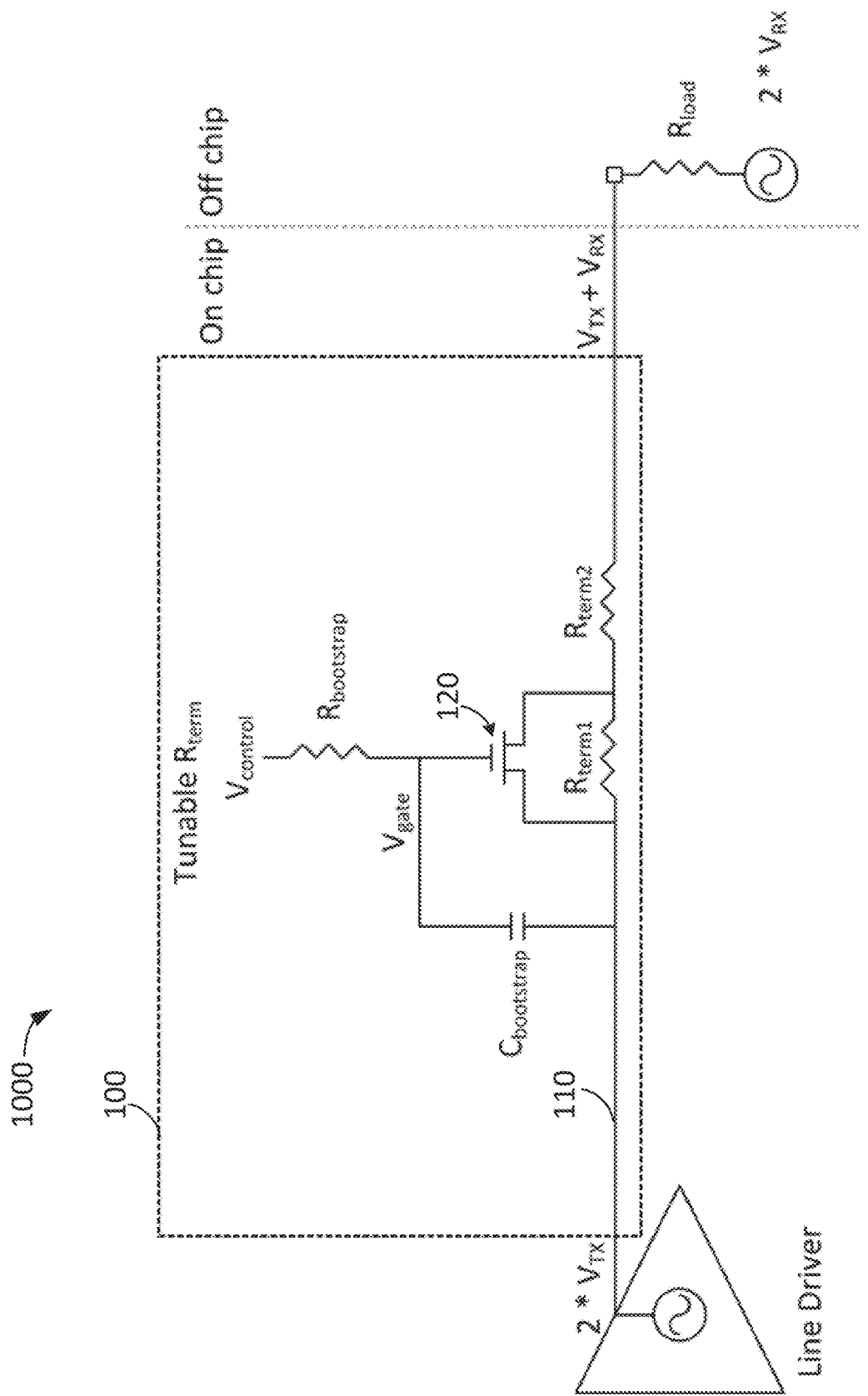
FIG. 1 is a conventional tunable termination resistor circuit for a line driver in communication systems.

The subject technology provides an on-chip tunable resistor circuit for impedance matching for communication systems. The circuit provides area-efficient on-chip components including one or more current sources to regulate current flow through a resistor and one or more diodes to charge and discharge a gate voltage of a transistor to track a signal voltage being transmitted through a signal line on the chip. The circuit includes a pair of termination resistors, each being tunable by controlling the gate voltage for matching impedance from on-chip components to off-chip components for transmitting the signal at all frequency ranges with minimum reflection. There are other embodiments as well.

In modern wired and wireless communications systems, a passive termination resistor is widely used to match impedance across communication interfaces to achieve return loss requirements in transmitters. When all transmitter components and the termination networks are integrated on a single semiconductor substrate, matching impedance from on-chip components to off-chip components becomes more difficult to meet return loss mask or output amplitude specification due to on-chip resistance variation. Traditional solutions use analog techniques to cope with the on-chip resistance variation, usually demanding higher voltage swing or linearity from a line driver, which is an electronic amplifier or circuit designed to enhance the transmission of signals over long distances by boosting the signal strength and ensuring it remains clear and intact. For example, the term "line" refers to any conductive path or transmission pathway within the circuit that is used to carry electrical signals. Line drivers are commonly used in communication systems, data transmission lines, and audio equipment to drive signals through cables with minimal loss and distortion. They can handle various signal types, including analog, digital, and differential signals, and are often characterized by their ability to provide high current and voltage outputs. However, using a larger line driver to boost higher signal voltage swing results in higher power consumption and a larger chip area. For example, to handle about 20% on-chip resistance variation around the target, the line driver would need to include at least 10% larger amplitude swing in the output voltage to meet the requirement of system output specification. For example, a line driver may be implemented using an electronic amplifier or circuit configured to enhance the transmission of signals over long distances by boosting the signal strength and ensuring it remains clear and intact. Depending on the implementation, a line driver can be integrated onto a single semiconductor substrate or be a discrete component within a communication system. The line driver may handle various signal types, including analog, digital, and differential signals. The line driver may include features for impedance matching, signal amplification, and maintaining signal integrity across different transmission media, such as cables, printed circuit board traces, or wireless communication channels.

FIG. 1 is a conventional tunable termination resistor circuit for a line driver of an on-chip transmitter in communication systems. As shown, the tunable termination resistor circuit 100 is implemented at a transmit output of an inline driver of an on-chip transmitter 1000 for matching impedance for on-chip components and off-chip components. The on-chip transmitter 1000 includes a line driver (an amplifier) to produce a signal output equal to twice a transmit (input) signal $V_{TX}$. The signal is passed through line 110 to the transmit output 190 with an output voltage equal to the sum of the transmit voltage $V_{TX}$ and a receive voltage $V_{RX}$. Line 100 refers to a transmission path associated with the on-chip transmitter 1000 and particularly refers to the path that is directly coupled to the tunable termination resistor circuit 100 or can be considered to be part of the circuit 100. Before the end of line 110, the tunable termination resistor circuit 100 is coupled to form a matching termination network. Circuit 100 includes a pair of termination resistors ($R_{term1}$ and $R_{term2}$) used to match the impedance of the on-chip components with the impedance of a load resistor $R_{load}$ representing an off-chip component. A control voltage $V_{control}$ drives a gate of a bootstrap switch to tune the resistance of the pair of termination resistors, ensuring signal linearity when switch 120 is on and off. Resistor $R_{bootstrap}$ and Capacitor $C_{bootstrap}$ are used in circuit 100 to regulate the gate voltage $V_{gate}$ of the bootstrap switch. Both $R_{bootstrap}$ and $C_{bootstrap}$ occupy large chip areas, becoming a major drawback for this circuitry design for this conventional circuit 100. In addition, bandwidth limitation prevents this approach of matching impedance at the interface between on-chip components and off-chip components to support low signal frequencies without a huge $C_{bootstrap}$ size.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent, or similar purpose unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Moreover, the terms left, right, front, back, top, bottom, forward, reverse, clockwise, and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and the use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

A general aspect of the subject technology includes an on-chip circuit for impedance matching for communication systems. The circuit includes a line driver configured in a line to output a signal voltage greater than an input voltage. The circuit also includes a transistor comprising a gate, a source, and a drain. The circuit also includes a first current source. The circuit also includes a first resistor coupled to the first current source and the line. The circuit also includes a first diode may include a first terminal and a second terminal. The first terminal is coupled to the first resistor and the second terminal is coupled to the gate of a transistor. The gate is coupled to a gate voltage. The circuit also includes a capacitor coupled to the gate and a source of the transistor. The circuit also includes a third resistor coupled in series to a fourth resistor in the line. The third resistor has two terminals coupled respectively to the source and the drain of the transistor. The third resistor and the fourth resistor may include resistances changed by the gate voltage. For example, the term "terminal" refers to a point of connection within an electrical or electronic circuit that allows for the attachment of components or the passage of electrical signals. A terminal can be a physical connection point, such as a pin, pad, lead, or contact on a device or component, through which electrical power or signals are introduced, transmitted, or received. Terminals may be part of various electronic components, including resistors, capacitors, transistors, diodes, integrated circuits, connectors, and other devices. They can serve multiple functions, such as providing input or output points for signals, grounding, or supplying power to the circuit. The specific design and function of a terminal can vary depending on its application and the type of component or system in which it is used.

Implementations may include one or more of the following features. The first diode may include a forward-bias mode with the first terminal being an anode and the second terminal being a cathode. For example, the term "forward-bias mode" refers to the condition in which a diode or similar semiconductor device allows current to flow through it. This occurs when the voltage applied across the device places the anode (positive side) at a higher potential than the cathode (negative side), thereby reducing the barrier to charge carrier movement and enabling current conduction. The capacitor may include a parasitic capacitance between the gate and the source of the transistor. The line driver, the first current source, the first resistor, the first diode, the capacitor, the transistor, the third resistor, and the fourth resistor are integrated as on-chip components into a semiconductor substrate. The third resistor and the fourth resistor may include an impedance termination network at an output of the line that is coupled to an off-chip component, the impedance termination network providing an output impedance for matching the impedance of the off-chip component. The output of the line may include an output voltage coupled to the off-chip component, where the output voltage is associated with a sum of the input voltage and a receive voltage on the off-chip component. The first current source and the first resistor provide an IR voltage drop minus a threshold voltage of the first diode for the gate voltage to track the signal voltage. The circuit may include a second current source coupled in series relative to the first resistor to the ground. The circuit may include a second diode coupled in parallel relative to the first diode and in series relative to the second current source and the gate of the transistor. The second diode is configured to have an inverse polarity relative to the first diode, providing a first path for discharging the gate of the transistor through the second current source to the ground. The circuit may include a third diode replacing the first resistor and a level-shifting sub-circuit coupled to the first current source, the level-shifting sub-circuit may include a fourth diode matched with the third diode to provide a second path equivalent to the first path for discharging the gate of the transistor.

Another general aspect of the subject technology includes an impedance-matching circuit for communication systems. The circuit also includes a first current source. The circuit also includes a first resistor coupled to the first current source and a signal line. The circuit also includes a first diode having an anode coupled to the first resistor and a cathode coupled to a gate of a transistor. The circuit also includes a second current source coupled to the first resistor to the ground. The circuit also includes a second diode having an anode coupled to the gate of the transistor and a cathode coupled to the second current source and the first resistor. The circuit also includes a capacitor coupled to the gate and the source of the transistor. The circuit also includes a third resistor coupled in series to a fourth resistor in the signal line. Each of the third resistor and the fourth resistor may include a respective resistance changed by the gate voltage.

Implementations may include one or more of the following features. The circuit where the first diode is configured to use a current from the first current source to charge the gate of the transistor and to restrict reverse current flow to the first current source. The capacitor may include a parasitic capacitance between the gate and the source of the transistor. The first current source, the second current source, the first resistor, the first diode, the second diode, the transistor, the third resistor, and the fourth resistor are integrated into a semiconductor substrate. The second diode is configured to provide a first path for discharging the gate of the transistor through the first resistor and the second current source to the ground. The circuit may include a third diode replacing the first resistor, the third diode being positioned to receive a current from the first current source to the signal line with the transistor being set ON and to discharge a current through the second current source in the first path to ground with the transistor being set OFF. The first current source is configured to couple to a level-shifting sub-circuit, the level-shifting sub-circuit may include a fourth diode matched with the third diode to provide a second path equivalent to the first path for changing the gate voltage. The circuit may include a line driver coupled to the signal line and configured to amplify an input voltage to a greater signal voltage transmitted in the signal line. The output yields an output voltage associated with a sum of the input voltage and the receive voltage on the load resistor. The third resistor and the fourth resistor form an impedance termination network with an output impedance controlled by the gate voltage to match the impedance associated with the load resistor.

Figure 2:
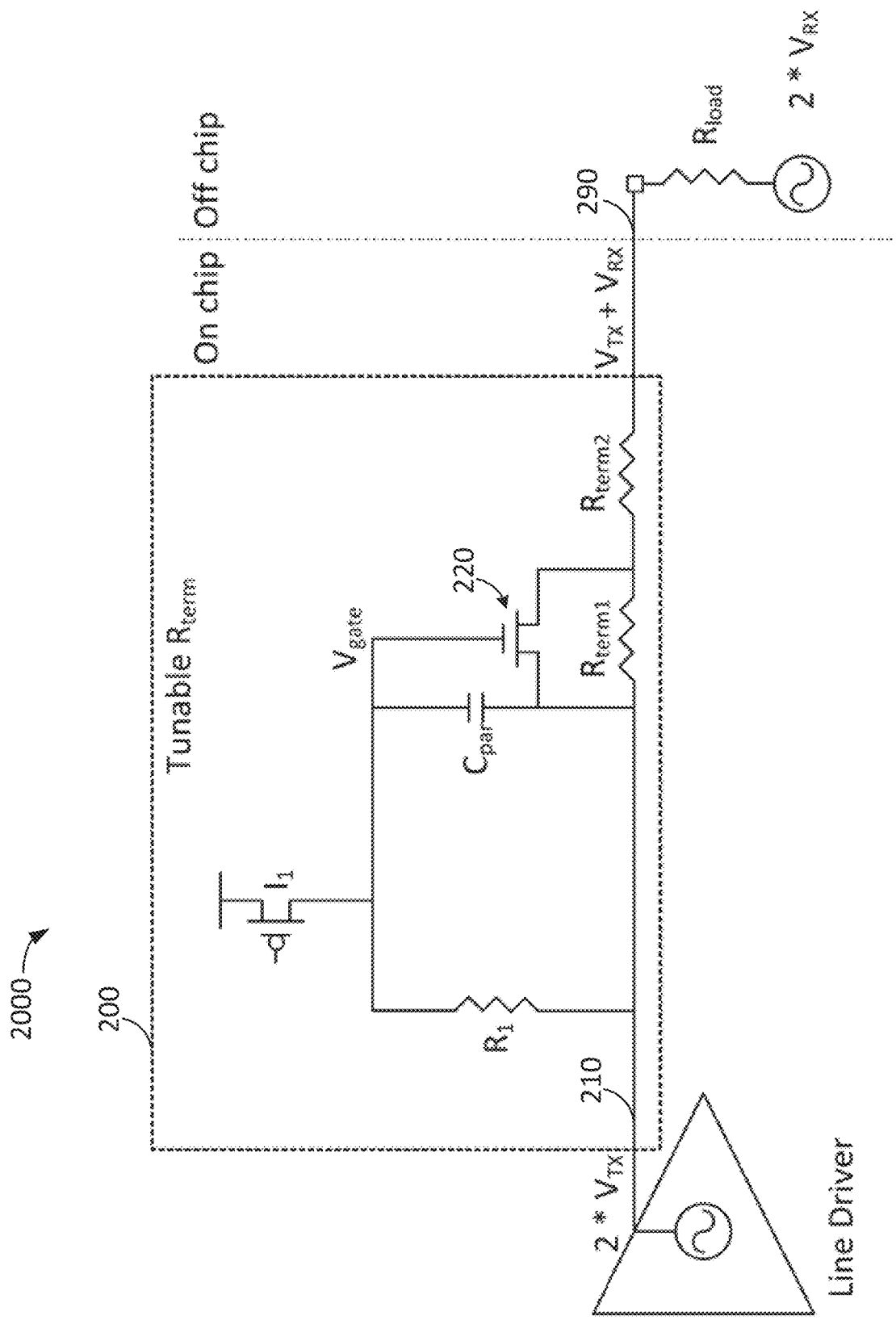
FIG. 2 is a tunable termination resistor circuit for a line driver in communication systems according to an embodiment of the subject technology.

FIG. 2 is a tunable termination resistor circuit for a line driver in communication systems according to an embodiment of the subject technology. This diagram is merely an example, which should not unduly limit the scope of the claims. One of ordinary skill in the art would recognize many variations, alternatives, and modifications. As shown, the line driver is a part of an on-chip transmitter 2000 integrated onto a single semiconductor substrate. The line driver's primary role is to amplify the signal for transmission over a signal line 210. It's designed to provide a bigger voltage swing, twice the transmit (input) voltage $V_{TX}$, necessary for the proper transmission of signals over longer (off-chip) distances. Circuit 200 uses a current source $I_1$ coupled to a supply voltage to provide a constant current for maintaining a voltage drop, an IR drop, across a resistor $R_1$ to help maintain the gate voltage $V_{gate}$ of a transistor switch 220 to track the signal $2V_{TX}$ at all frequencies. The simple on-chip resistor $R_1$ can be much more chip-area efficient and power efficient than the conventional bootstrap resistor $R_{bootstrap}$. For example, a current source may be an electrical or electronic device that delivers or absorbs a constant current regardless of the voltage across it or the load it is driving. This characteristic is useful in various applications, such as analog circuits, signal processing, and current-mode control systems. Current sources are often used in biasing transistors, providing stable reference currents, and in situations where precise current control is necessary.

The capacitor $C_{par}$, a parasitic capacitance that existed across the gate and source of the transistor 220, is to replace the big-sized $C_{bootstrap}$ of FIG. 1 to stabilize the gate voltage $V_{gate}$. For example, the term "parasitic resistance" refers to the unintended and unavoidable capacitance that exists between parts of a circuit due to their proximity to each other. Parasitic capacitance is not designed into the circuit but results from the physical characteristics and layout of the components and their interconnections. Parasitic capacitance can occur, for example, between adjacent conductors, between a conductor and the substrate, or between different layers of a multi-layer circuit board. It can influence the performance of high-frequency circuits, affecting signal integrity, speed, and power consumption. A pair of tunable termination resistors ($R_{term1}$ and $R_{term2}$) represent a dynamically adjustable resistance termination network used to match the impedance of the on-chip line driver at a transmit output 219 of line 210 to minimize reflections at the on-chip off-chip interface. In an example, $R_{term1}$ is coupled in series to $R_{term2}$ and coupled respectively to the source and the drain of transistor 220. The transmit output 219 is located at the end of line 210 and associated with an on-chip off-chip interface from on-chip components including the line driver to off-chip components such as a load resistor. Reflections usually occur when the impedance levels are mismatched across the on-chip off-chip interface to an off-chip load resistor $R_{load}$. The gate voltage $V_{gate}$ controls the transistor's operation to tune the pair of tunable termination resistors ($R_{term1}$ and $R_{term2}$) to alter the impedance seen by the line. The pair of tunable termination resistors ($R_{term1}$ and $R_{term2}$) comprise an effective impedance termination network positioned on-chip at an output of the line that is coupled to an off-chip component, the impedance termination network providing an output impedance for matching the impedance of the off-chip component. An impedance termination network is a circuit or arrangement of components used to match the impedance of a transmission line with its load to minimize signal reflections and ensure efficient power transfer. These networks are critical in various applications, including telecommunications, radio frequency (RF) systems, and high-speed digital circuits, where signal integrity is paramount. The impedance termination network can consist of resistors, capacitors, inductors, or a combination of these elements, configured to provide the necessary impedance matching. By ensuring that the impedance of the load matches the characteristic impedance of the transmission line, these networks help maintain signal quality, reducing noise, and preventing signal loss. The degree to which impedances are considered matched can be quantitatively expressed using the Standing Wave Ratio (SWR). SWR is a measure of the impedance matching effectiveness and indicates how much of the signal is reflected from the load. An SWR of 1:1 is ideal, indicating perfect matching, with no reflected power. In practical applications, an SWR of 1.5:1 is generally acceptable, indicating that about 4% of the power is reflected back. Systems can typically tolerate an SWR as high as 2:1 without significant performance degradation, which corresponds to about 11% reflected power.

However, due to the high-voltage output specification of the line driver, the output swing from the line driver (into circuit 200) would approach the supply voltage for the current source $I_1$. If $V_{gate}$, which controls the transistor in the tunable resistance termination network, is tied to the line driver's output, it might exceed the maximum allowable voltage for $V_{gate}$. This can happen especially if $V_{gate}$ swings beyond the supply voltage used for the gate of the transistor. High $V_{gate}$ can cause reliability issues, impact the longevity of the transistor, or result in non-linear behavior not suitable for the intended function of providing a stable current. Excessive voltage swings can challenge the stability of the voltage regulation and power supply components, leading to fluctuations that can affect the entire circuit's performance.

Figure 3:
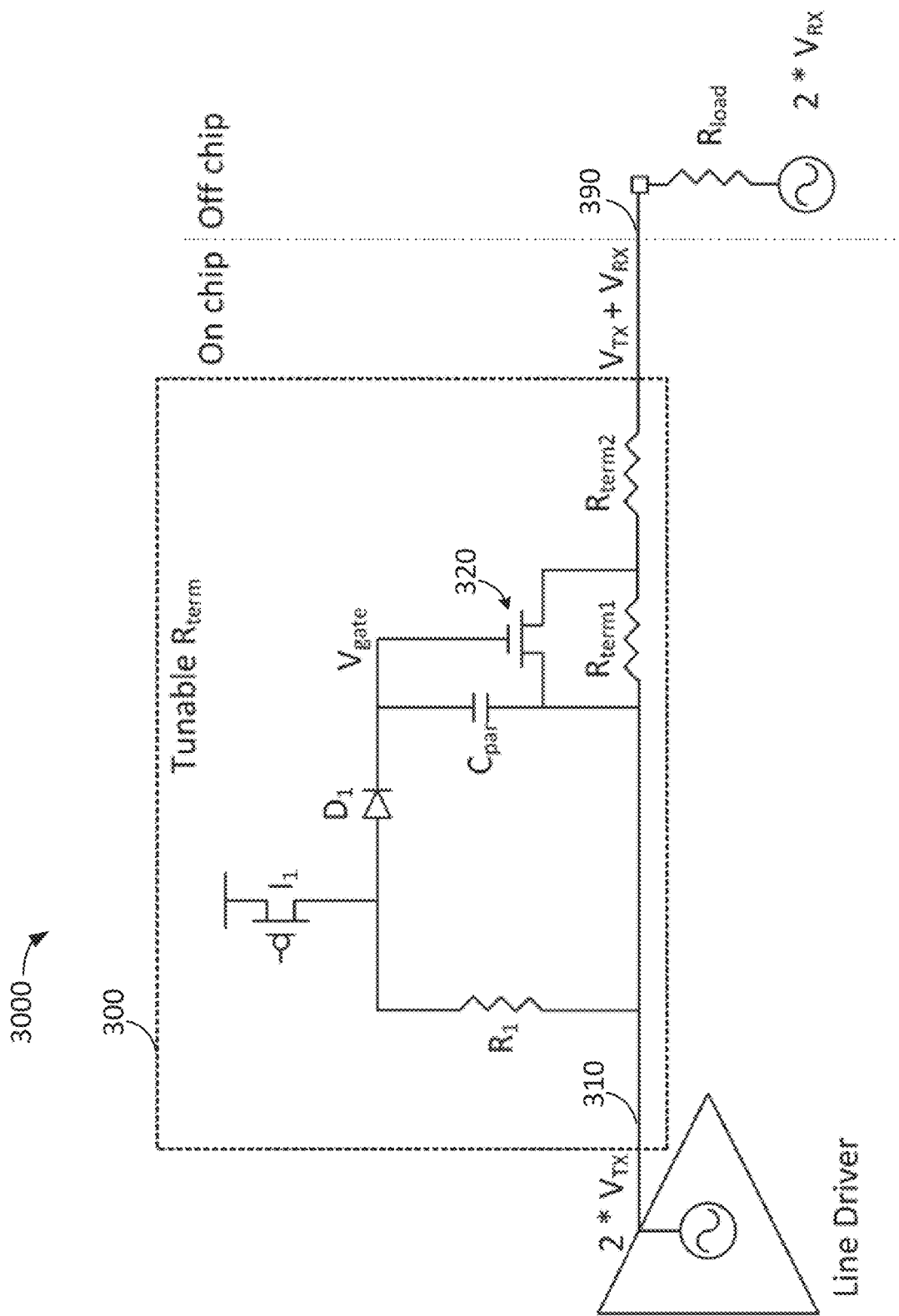
FIG. 3 is a tunable termination resistor circuit for a line driver in communication systems according to another embodiment of the subject technology.

FIG. 3 is a tunable termination resistor circuit for a line driver in communication systems according to another embodiment of the subject technology. This diagram is merely an example, which should not unduly limit the scope of the claims. One of ordinary skill in the art would recognize many variations, alternatives, and modifications. As shown, the tunable termination resistor circuit 300 is coupled at the end of line 310 of a line driver, forming part of the on-chip transmitter 3000 integrated onto a single semiconductor substrate. In an embodiment, a diode $D_1$ is added to the tunable termination resistor circuit 300 (compared with circuit 200 in FIG. 2) to provide improved control of the tunable resistance termination network ($R_{term1}$ and $R_{term2}$). In an example, $R_{term1}$ is coupled in series to $R_{term2}$ and coupled respectively to the source and the drain of transistor 320. Diode $D_1$ has its anode coupled in series to the current source $I_1$ (as well as the resistor $R_1$) and its cathode coupled to the gate of transistor 320. Diodes are often used to protect circuits by preventing the backflow of current that might occur due to reverse voltage spikes. The diode ensures that while the gate voltage can be boosted by the line driver's output, the signal voltage, does not feed back into other circuit components inappropriately. This is aimed at protecting the gate of transistor 320 or any other sensitive components in circuit 300 from negative voltages or reverse currents that might otherwise damage them. Specifically in FIG. 3, diode $D_1$ ensures that the gate voltage $V_{gate}$ applied to the tunable resistance termination network ($R_{term1}$ and $R_{term2}$) can only influence circuit 300 in one preferred direction, effectively controlling the operational behavior and response of the network and enhances the stability and reliability of the circuit.

In an embodiment, diode $D_1$ provides a controlled amount of current flow to the gate of the transistor 320, and the current source $I_1$ doesn't need to be constantly active but operates intermittently to compensate for charge loss through leakage of the diode $D_1$. $C_{par}$ acts as a buffer for $V_{gate}$ by storing charge and helping to maintain stable gate voltage levels despite potential fluctuations in the line driver's output. The charges on the gate of transistor 320 stay constant. Through the gate-source capacitor $C_{par}$, it effectively bootstraps the gate voltage $V_{gate}$ to the line driver output swing. This circuitry design helps maintain a constant charge on the gate, essential for stable operation. The first current source $I_1$ and the first resistor $R_1$ provide an IR voltage drop minus a threshold voltage of the first diode $D_1$ for the gate voltage $V_{gate}$ to track the signal voltage in signal line 310. For example, the term "IR voltage" refers to IR voltage refers to the voltage drop across a resistor or other component in an electrical circuit due to the flow of current through it. This setup allows circuit 300 to handle high output swings from the line driver without compromising the stability or performance of controlling $V_{gate}$ for tuning the resistance termination network to match the impedance of an off-chip load resistor $R_{load}$ coupled to a transmit output 390 at the end of the signal line 310.

Figure 4:
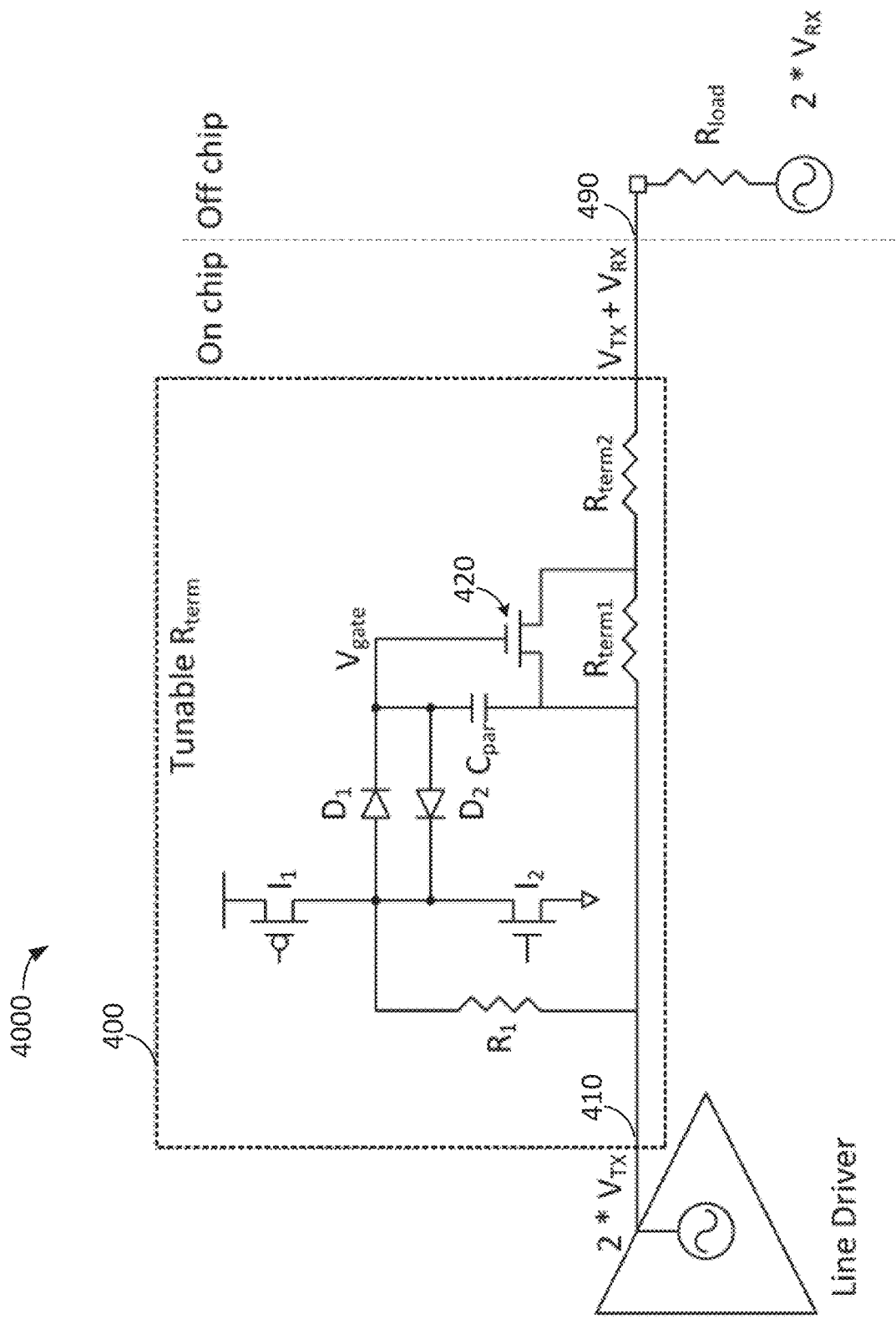
FIG. 4 is a tunable termination resistor circuit for a line driver in communication systems according to yet another embodiment of the subject technology.

FIG. 4 is a tunable termination resistor circuit for a line driver in communication systems according to yet another embodiment of the subject technology. This diagram is merely an example, which should not unduly limit the scope of the claims. One of ordinary skill in the art would recognize many variations, alternatives, and modifications. As shown, the tunable termination resistor circuit 400 is coupled at the end of line 410 of a line driver as a part of an on-chip transmitter 4000 integrated onto a single semiconductor substrate. In an embodiment, circuit 400 includes new additions of a second diode $D_2$, and a second current source $I_2$, enhancing the functionality and control over the circuit, especially in terms of directional current control and voltage stability.

Diode $D_2$ is oriented in the opposite direction of diode $D_1$ coupled in parallel with $D_1$, one end to a node between the first current source $I_1$ and the resistor $R_1$, and another end to the gate of transistor 420. The use of two diodes in opposite directions can allow for more controlled bidirectional current flow, providing protection against reverse currents in both directions and enabling more complex voltage control across the circuit. The second current source 12 is also coupled with one end to the node between the first current source $I_1$ and the resistor $R_1$ and another end to the ground. The addition of a second current source $I_2$ provides another path for current flow, which can be used for additional control over the operational conditions within the circuit, such as balancing currents or creating different voltage drops. With two current sources ($I_1$ and $I_2$), the circuit can more effectively manage voltage levels across different parts of the circuit. For example, $I_2$ can help stabilize the voltage drop across $R_1$ or influence the voltage at the node between $D_1$ and $D_2$, contributing to overall voltage stability.

When the current flows from $I_1$ to $R_1$ the transistor 420 is turned ON by the gate voltage $V_{gate}$. This current helps in setting the voltage drop, IR drop, across itself based on Ohm's Law, where $R_1$ acts as a limiting factor for the voltage, ensuring that the transistor is not subjected to excessive gate voltage which might exceed its maximum ratings. The current reaches diode $D_1$, which is forward-biased and allows the current to pass through to charge the gate of the transistor 420 when the transistor is turned ON. Diode $D_1$ also ensures that current does not flow back towards the current source $I_1$ and resistor $R_1$ when the switch transistor is off, providing directional control and protection against potential reverse bias that could damage the circuit. For example, the term "forward-bias mode refers to the condition in which a diode or similar semiconductor device allows current to flow through it, which occurs when the voltage applied across the device places the anode (positive side) at a higher potential than the cathode (negative side), reducing the barrier to charge carrier movement and enabling current conduction."

When the transistor is turned OFF, diode $D_2$ is forwarded biased and allows current flow from the gate towards the second current source $I_2$, which provides a sink. This diode ensures that the discharge current does not affect the transistor 420 or flow back into other sensitive parts of the circuit. The second current source $I_2$ coupled to the ground provides a discharge path for the transistor 420, which is needed to turn it off. The discharge path allows current to pass the resistor $R_1$, which limits and controls the amount of voltage by creating the IR drop. This discharge path is for maintaining the circuit's stability and preventing damage due to high voltage accumulation at the gate of transistor 420 and other nodes when the transistor is off. It also makes transient switching fast, enhancing the ability of the transistor 420 to track the fast-changing signal voltage swing of the line driver in the signal line 410 during its operation to control the $V_{gate}$. The enhanced control of $V_{gate}$ in the proposed circuit 400 allows it to tune the resistance termination network ($R_{term1}$ and $R_{term2}$) for keeping the impedance of the on-chip components to match with off-chip load resistor $R_{load}$ positioned after the transmit output 490 of the signal line 410.

Figure 5:
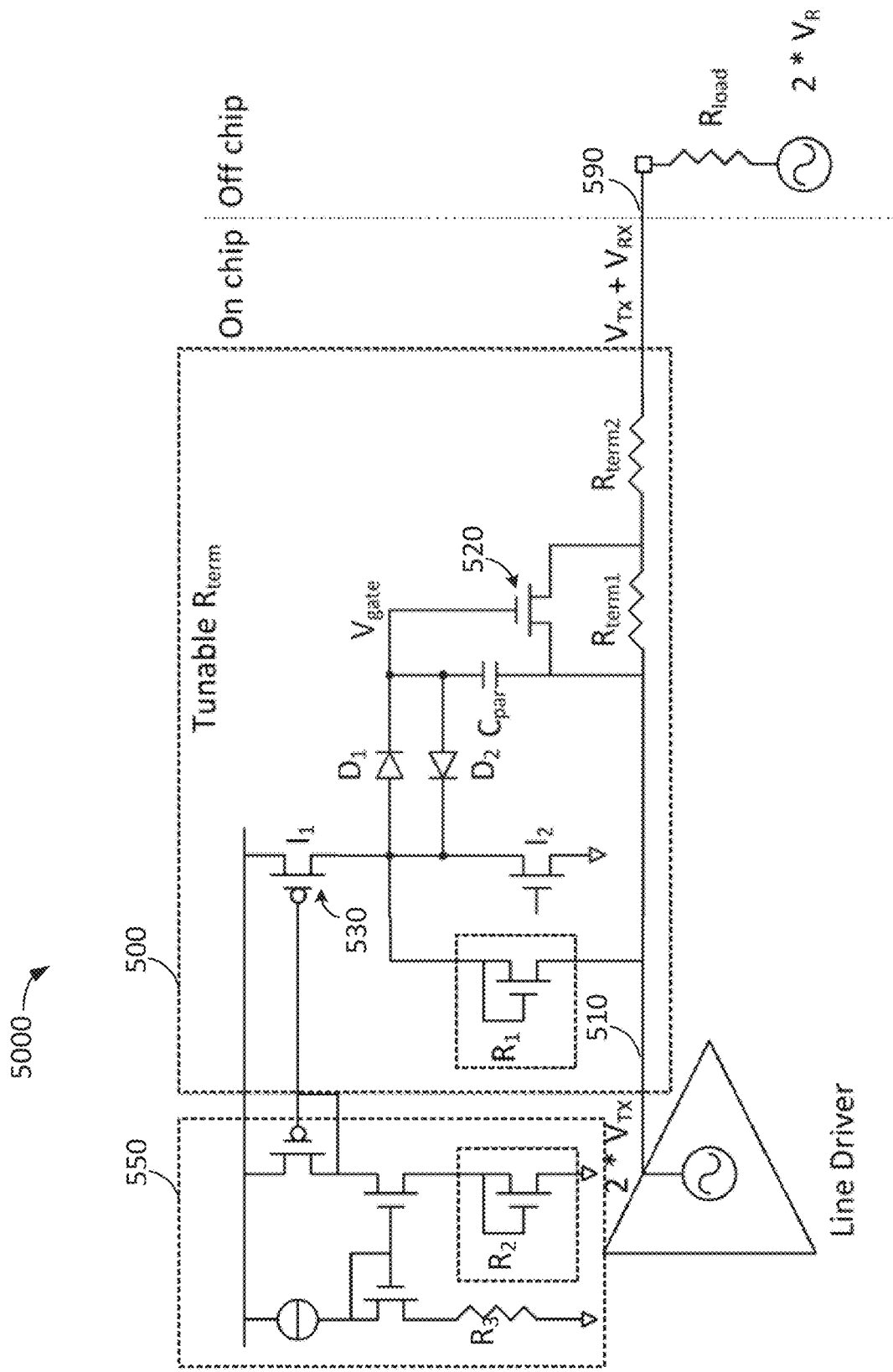
FIG. 5 is a tunable termination resistor circuit for a line driver in communication systems according to still another embodiment of the subject technology.

FIG. 5 is a tunable termination resistor circuit for a line driver in communication systems according to still another embodiment of the subject technology. This diagram is merely an example, which should not unduly limit the scope of the claims. One of ordinary skill in the art would recognize many variations, alternatives, and modifications. As shown, the tunable termination resistor circuit 500 is coupled to an output of a line driver in a signal line as a part of an on-chip transmitter 5000 integrated onto a single semiconductor substrate. In an embodiment, circuit 500 includes a third diode (or a diode converted from a transistor) $R_1$ to replace the resistor $R_1$ in FIG. 4. Diode $R_1$ is configured to receive a current from the first current source $I_1$ with the transistor 520 being set ON and to discharge a current through the second current source $I_2$ in the first discharge path to ground with the transistor 520 being set OFF. The current from the first current source $I_1$ flows through the diode $R_1$ to the signal line 510 in one direction, protecting the circuit from potential reverse currents that could harm the transistor or cause unstable operation. Diode $R_1$ also becomes a component with a predictable forward voltage drop (using current from the second current source $I_2$) in a first discharge path for making the transistor turn off fast. The diode $R_1$ has a characteristic voltage drop (typically around 0.7 volts for a standard silicon diode), which remains relatively constant regardless of the amount of current flowing through it, as long as the diode is forward-biased and the current stays within the diode's rated limits.

Also, circuit 500 is coupled, via a gate of a control transistor 530 of the first current source $I_1$, to a level-shifting sub-circuit 550 that may be pre-integrated in the same substrate and shared with the system on chip. The level-shifting sub-circuit 550 includes at least a fourth diode $R_2$ and a third resistor $R_3$ coupled to the ground. The fourth diode $R_2$ is configured to match the third diode $R_1$ in circuit 500. Diode $R_2$ provides a fixed voltage drop in one direction towards $R_3$, preventing backflow towards the second current source $I_2$ and the third diode $R_1$. This creates a second discharge path for helping the gate voltage $V_{gate}$ to be stabilized during large output swings from the line driver. This arrangement allows independent adjustment of different parts of the circuit without influencing each other directly. The combined voltage drops across $R_1$, $R_2$, and $R_3$ set the final gate voltage $V_{gate}$ for the transistor 520. The main purpose of this sub-circuit is to shift the voltage level from a higher potential to a lower potential suitable for the gate of the transistor. This allows the gate voltage to be precisely set to a value that optimally controls the conductivity of the transistor, thereby adjusting the resistance of the pair of termination resistors ($R_{term1}$ and $R_{term2}$) for matching impedance from on-chip to off-chip effectively. The use of a matched diode $R_2$ and resistor $R_3$ creates an equivalent discharge path that helps stabilize the gate voltage $V_{gate}$ by providing a consistent and predictable voltage IR drop, which is less susceptible to fluctuations in supply voltage or variations in other parts of the circuit.

In an embodiment, the line driver and the tunable termination resistor circuit including the first current source, the first resistor, the first diode, the capacitor, the transistor, and the pair of termination resistors are on-chip components integrated into a single semiconductor substrate. The line driver is configured to output a signal voltage that is equal to or greater than twice an input voltage to be transmitted in a signal line through the tunable termination resistor circuit. In an embodiment, the line driver, the tunable termination resistor circuit, and the level-shifting sub-circuit are all the on-chip components integrated into a semiconductor substrate. The pair of termination resistors serves as a resistance termination network for on-chip components on the substrate and is tunable to match the impedance of off-chip components, such as a load resistor, to achieve signal transmission with minimized reflection. The circuit, which is positioned at the end of the signal line, has an output coupled to a load resistor positioned off the semiconductor substrate. The output yields an output voltage equal to the sum of the input voltage and the receive voltage across the load resistor.

While the above is a full description of the specific embodiments, various modifications, alternative constructions, and equivalents may be used. therefore, the above description and illustrations should not be taken as limiting the scope of the present invention which is defined by the appended claims.

What is claimed is:

1. A circuit comprising:
   a line driver configured in a line to output a signal voltage greater than an input voltage;
   a transistor comprising a gate, a source, and a drain;
   a first current source;
   a first resistor coupled to the first current source and the line;
   a first diode comprising a first terminal and a second terminal, the first terminal being coupled to the first resistor and the second terminal being coupled to the gate of the transistor, the gate being coupled to a gate voltage;
   a capacitor coupled to the gate and to the source of the transistor; and
   a third resistor configured in series relative to a fourth resistor in the line, the third resistor having two terminals coupled respectively to the source and the drain of the transistor, the third resistor and the fourth resistor being characterized by a resistance change associated with the gate voltage.

2. The circuit of claim 1, wherein the first diode comprises a forward-bias mode with the first terminal being an anode and the second terminal being a cathode.

3. The circuit of claim 1, wherein the capacitor comprises a parasitic capacitance between the gate and the source of the transistor.

4. The device of claim 1, wherein the line driver, the first current source, the first resistor, the first diode, the capacitor, the transistor, the third resistor, and the fourth resistor are configured as on-chip components into a semiconductor substrate.

5. The circuit of claim 4, wherein the third resistor and the fourth resistor comprise an impedance termination network at an output of the line that is coupled to an off-chip component, the impedance termination network providing an output impedance for matching the impedance of the off-chip component.

6. The circuit of claim 5, wherein the output of the line comprises an output voltage coupled to the off-chip component, wherein the output voltage is associated with a sum of the input voltage and a receive voltage on the off-chip component.

7. The circuit of claim 1, wherein the first current source and the first resistor provide an IR voltage drop minus a threshold voltage of the first diode for the gate voltage to track the signal voltage.

8. The circuit of claim 1, further comprising a second current source configured in series relative to the first resistor to ground.

9. The circuit of claim 8, further comprising a second diode configured in parallel relative to the first diode and series relative to the second current source and the gate of the transistor, the second diode is configured to have an inverse polarity relative to the first diode, providing a first path for discharging the gate of the transistor through the second current source to the ground.

10. The circuit of claim 9, further comprising a third diode replacing the first resistor and a level-shifting sub-circuit coupled to the first current source, the level-shifting sub-circuit comprising a fourth diode matched with the third diode to provide a second path equivalent to the first path for discharging the gate of the transistor.

11. A circuit for impedance matching for inline communication comprising:
    a first current source;
    a first resistor coupled to the first current source and a signal line;
    a first diode having an anode coupled to the first resistor and a cathode coupled to a gate of a transistor;
    a second current source coupled to the first resistor to the ground;
    a second diode having an anode coupled to the gate of the transistor and a cathode coupled to the second current source and the first resistor;
    a capacitor coupled to the gate and the source of the transistor; and
    a third resistor coupled in series to a fourth resistor in the signal line, each of the third resistor and the fourth resistor comprising a respective resistance changed by the gate voltage.

12. The circuit of claim 11, wherein the first diode is configured to use a current from the first current source to charge the gate of the transistor and to restrict reverse current flow to the first current source.

13. The circuit of claim 11, wherein the capacitor comprises a parasitic capacitance between the gate and the source of the transistor.

14. The circuit of claim 11, wherein the first current source, the second current source, the first resistor, the first diode, the second diode, the transistor, the third resistor, and the fourth resistor are integrated into a semiconductor substrate.

15. The circuit of claim 14, wherein the second diode is configured to provide a first path for discharging the gate of the transistor through the first resistor and the second current source to the ground.

16. The circuit of claim 15, further comprising a third diode replacing the first resistor, the third diode being positioned to receive a current from the first current source to the signal line with the transistor being set ON and to discharge a current through the second current source in the first path to ground with the transistor being set OFF.

17. The circuit of claim 16, wherein the first current source is configured to couple to a level-shifting sub-circuit, the level-shifting sub-circuit comprising a fourth diode matched with the third diode to provide a second path equivalent to the first path for changing the gate voltage.

18. The circuit of claim 17, comprising a line driver coupled to the signal line and configured to amplify an input voltage to a greater signal voltage transmitted in the signal line.

19. The circuit of claim 18, comprising an output coupled to a load resistor positioned off the semiconductor substrate, wherein the output yields an output voltage associated with a sum of the input voltage and a receive voltage on the load resistor.

20. The circuit of claim 19, wherein the third resistor and the fourth resistor form an impedance termination network with an output impedance controlled by the gate voltage to match the impedance associated with the load resistor.

* * * * *